US008456257B1

(12) United States Patent
Fattinger

(10) Patent No.: US 8,456,257 B1
(45) Date of Patent: Jun. 4, 2013

(54) BULK ACOUSTIC WAVE DEVICES AND METHOD FOR SPURIOUS MODE SUPPRESSION

(75) Inventor: Gernot G. Fattinger, Sorrento, FL (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 642 days.

(21) Appl. No.: 12/617,036

(22) Filed: Nov. 12, 2009

(51) Int. Cl.
*H03H 9/15* (2006.01)
*H03H 9/54* (2006.01)

(52) U.S. Cl.
USPC .......................... 333/187; 310/312; 310/364

(58) Field of Classification Search
USPC .......................... 333/187–192; 310/312, 364
See application file for complete search history.

(56) References Cited

U.S. PATENT DOCUMENTS

| | | | |
|---|---|---|---|
| 4,775,846 A | 10/1988 | Shiba et al. | |
| 5,789,845 A | 8/1998 | Wadaka et al. | |
| 6,081,171 A | 6/2000 | Ella | |
| 6,182,619 B1 | 2/2001 | Spitzer et al. | |
| 6,291,391 B1 | 9/2001 | MacArthur | |
| 6,424,237 B1 * | 7/2002 | Ruby et al. | 333/187 |
| 6,548,943 B2 | 4/2003 | Kaitila et al. | |
| 6,788,170 B1 | 9/2004 | Kaitila et al. | |
| 6,878,604 B2 | 4/2005 | Aigner et al. | |
| 7,173,361 B2 * | 2/2007 | Saito et al. | 310/320 |
| 7,369,013 B2 * | 5/2008 | Fazzio et al. | 333/187 |
| 7,560,853 B2 * | 7/2009 | Sano et al. | 310/324 |
| 7,598,826 B2 * | 10/2009 | Yamaguchi et al. | 333/187 |
| 7,649,304 B2 * | 1/2010 | Umeda et al. | 310/320 |
| 7,768,364 B2 * | 8/2010 | Hart et al. | 333/187 |
| 7,893,793 B2 * | 2/2011 | Iwasaki et al. | 333/133 |
| 8,093,962 B2 * | 1/2012 | Taniguchi et al. | 333/133 |
| 8,248,185 B2 * | 8/2012 | Choy et al. | 333/187 |
| 2004/0056735 A1 * | 3/2004 | Nomura et al. | 333/133 |
| 2006/0103492 A1 * | 5/2006 | Feng et al. | 333/187 |
| 2006/0132262 A1 * | 6/2006 | Fazzio et al. | 333/187 |
| 2007/0210877 A1 * | 9/2007 | Osugi et al. | 333/187 |
| 2008/0042780 A1 * | 2/2008 | Lee et al. | 333/187 |
| 2008/0179995 A1 * | 7/2008 | Umeda et al. | 310/324 |
| 2009/0039981 A1 | 2/2009 | Ito et al. | |
| 2009/0079302 A1 | 3/2009 | Wall et al. | |
| 2009/0096549 A1 | 4/2009 | Thalhammer et al. | |
| 2009/0153268 A1 * | 6/2009 | Milsom et al. | 333/187 |

OTHER PUBLICATIONS

Aigner, Robert; Bringing BAW Technology into Volume Production: The Ten Commandments and the Seven Deadly Sins; 3rd International Symposium on Acoustic Wave Devices for Future Mobile Communication Systems, Chiba Japan; Mar. 6-8, 2007.
Fattinger, G.G, Fattinger, M.R., Diefenbeck, K., Muller, P., Aigner, R.; Spurious Mode Supression in Coupled Resonator Filters; Microwave Symposium Digest; 2005 IEEE M-S International; Publication Date Jun. 12-17, 2005.

(Continued)

*Primary Examiner* — Barbara Summons
(74) *Attorney, Agent, or Firm* — Schwabe Williamson & Wyatt

(57) ABSTRACT

A bulk acoustic wave resonator desirably suppressing spurious modes includes a frame-like structure of mass loading contacting one electrode, wherein the frame-like structure is defined within inner and outer boundaries and wherein a central area extends through the resonator within an envelope of the inner boundary and a border region extends through the resonator within the inner and outer boundaries of the frame-like structure. A second electrode is positioned within the envelope and substantially missing from within the border region. A layer of piezoelectric material is embedded between the first and second electrodes. An active resonator area is substantially within the central area. The resonator structure is carried on a substrate and an acoustically reflective mirror having multiple and alternating layers of low and high acoustic impedance material.

24 Claims, 12 Drawing Sheets

OTHER PUBLICATIONS

Lambert, C., Borrello, D., Choffat, H., Jacot, P., Kuegler, E.; BAW Devices: Technology Overview and Manufacturing Aspects; 2nd International Symposium on Acoustic Wave Devices for Future Mobile Communication Systems; Mar. 3-5, 2004; Chiba University, Japan.

Lubecke, Victor M., Barber, Bradley P., Fetter, Linus A.; High-Q MEMS for Wireless Integrated Circuits; Microwave Review; Dec. 2001; pp. 28-34.

Hiroyuki Okitsu, Keishin Koh, Kohji Hohkawa; "A Basic Study on Mode Coupling SAW Device with Face to Face Bonding"; Symposium on Ultrasonic Electronics, vol. 30; pp. 279-280; Nov. 18-20, 2009.

Keishin Koh, Takanori Yamazaki, Yuji Terao, Kohji Hohkawa; "Study on SAW Devices Having Face to Face Aligned Package Structure", IEEE International Ultrasonics Symposium Proceedings; pp. 1596-1599; 2008.

* cited by examiner

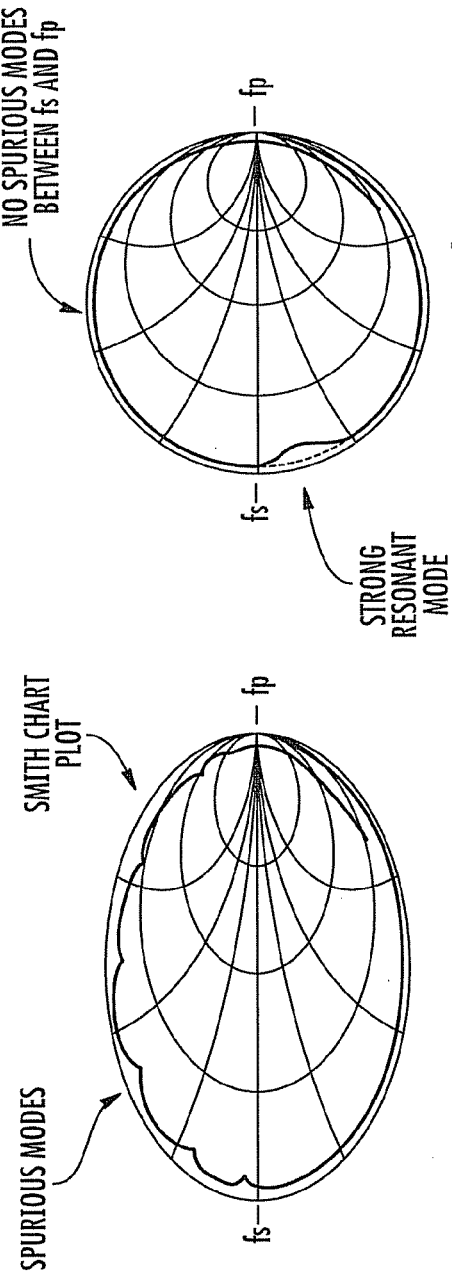
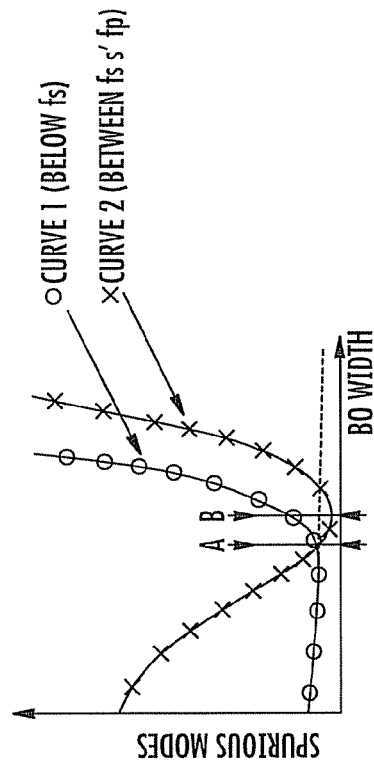
FIG. 4a (PRIOR ART)
FIG. 4b (PRIOR ART)
FIG. 4c

BULK ACOUSTIC WAVE DEVICES AND METHOD FOR SPURIOUS MODE SUPPRESSION

FIELD OF INVENTION

The invention generally relates to bulk acoustic wave (BAW) devices, and more particularly to BAW resonators and use of such BAW resonators in filters for application in RF communication systems.

BACKGROUND

The BAW resonator typically comprises a thin layer of a piezoelectric material embedded between two metal electrodes. When an RF electric field is applied at the metal electrodes, the piezoelectric material will convert the electrical energy into mechanical energy in the form of acoustic waves. The resonance frequency of the resonator will depend on the thickness of the piezoelectric material. As illustrated with reference to FIG. 1, this resonator structure may be solidly mounted on a layer of a reflective structure having alternatively high and low acoustic impedance characteristics. Such BAW resonators are commonly known as a solidly mounted BAW resonator (SBAR). Alternatively, the resonator structure may be mounted on a substrate with an air cavity. Such a structure is commonly referred to as a thin film bulk acoustic resonator (FBAR). Multiple resonators are typically arranged either in a series arm or a parallel arm of a ladder filter as illustrated with reference to FIG. 2.

Each resonator exhibits a series resonant frequency and a parallel resonant frequency. The parallel resonant frequency occurs at a slightly higher frequency than the series resonant frequency. At the series resonant frequency, the resonator behaves as a low impedance element. At the parallel resonant frequency, the resonator behaves as a high impedance element. Thus, in the design of the ladder filter illustrated by way of example with continued reference to the configuration of FIG. 2, it is desirable to set the series resonant frequency of the series arm resonators and the parallel resonant frequency of the parallel arm resonators at the nominal center frequency of a bandpass filter. Such a ladder filter design configuration will yield low insertion loss across the passband that is normally correlated to the difference between the series and parallel resonant frequencies of the resonator.

In order to achieve a smooth passband across a filter bandwidth, it is desirable to have minimal spurious responses. The resonator structure of FIG. 2 exhibits a spurious response due to the excitation of lamb waves at the electrode edges. One method of suppressing spurious Lamb modes in BAW devices is the application of additional mass loading to the top electrode of the resonator in a ring-like region at the boundaries of the active area as shown in the cross-sectional view of FIG. 3 and top view of FIG. 3a. By way of example, U.S. Pat. No. 6,548,943 to Kaitilla et al. discloses use of the border region above the top electrode to control the spurious modes. As disclosed in Kaitilla, the border region separates the resonator into two zones, an inner center zone and an outer border region area. Adjusting the thickness and the width of the frame-like or ring structure has been shown to reduce the spurious responses between the series resonant frequency (fs) and the parallel resonant frequency (fp) of the resonator.

By way of further example and with reference to FIG. 4a, a Smith Chart plot of the resonator illustrates a width of the ring structure not wide enough to provide an optimum or desirable spurious suppression between the fs and fp. FIG. 4b illustrates one case in which the border region width is wide enough to suppress the spurious modes between fs and fp. However, it exhibits a strong resonant mode below fs. FIG. 4c illustrates the spurious modes characteristics as a function of the border region width, wherein Curve 1 quantifies the resonant mode and illustrates results with a relatively small width and wherein a resonant mode below fs is very well suppressed. However, it has high spurious modes falling between fs and fp as shown in Curve 2, quantifying the strength of the spurious mode (so called "dimples" of FIG. 4a between fs and fp) when the border region width is large enough as shown in point B on Curve 2 to provide maximum suppression of spurious modes between fs and fp. The resonant mode below fs begins to increase sharply. Thus, the ring structure provides a means to suppress passband spurious modes, but undesirably introduces a strong resonant mode below fs. As will be discussed with regard to the invention, the resonant mode is due to the parasitic electric field arising in the ring region directly under the top electrode ring region and the bottom electrode as illustrated with reference to FIG. 3. It is desirable to implement a border ring or frame-like structure wide enough to suppress spurious modes, but with only a limited parasitic electric field.

SUMMARY

The present invention may be embodied in a resonator structure comprising a first electrode, a frame-like structure of mass loading contacting the first electrode, wherein the frame-like structure is defined within inner and outer boundaries thereof, and wherein a central area extends through the resonator within an envelope of the inner boundary and a border region extends through the resonator as defined within the inner and outer boundaries of the frame-like structure, a second electrode opposing the first electrode, the second electrode positioned within the envelope and substantially missing from within the border region, and a layer of piezoelectric material embedded between the first and second electrodes, wherein an active resonator area is substantially within the central area.

The resonator structure may further comprise a substrate supporting one of the first and second electrodes. The substrate may comprise a cavity extending within the central area for forming an acoustic mirror. An acoustically reflective mirror may be formed proximate one of the first and second electrodes. The reflective mirror may comprise multiple and alternating layers of low and high acoustic impedance material.

A method aspect of et invention may comprise selecting a supporting substrate, forming a reflective mirror onto a surface of the supporting substrate, depositing a frame-like structure of mass loading onto the reflective mirror, wherein the frame-like structure is defined within inner and outer boundaries thereof, and wherein a central area extends through the acoustic wave device within an envelope of the inner boundary and a border region extends therethrough as defined within the inner and outer boundaries of the frame-like structure, layering a first electrode onto the frame-like structure within the outer boundary thereof, depositing a piezoelectric layer onto the first electrode, and layering a second electrode onto the piezoelectric layer opposing the first electrode, the second electrode positioned within the envelope and substantially missing from within the border region.

Alternatively, a method aspect of the invention may comprise selecting a supporting substrate, forming a reflective mirror onto a surface of the supporting substrate, defining a central area extending through the acoustic wave device within an envelope of an inner boundary of a border region, the border region defined by the inner boundary and an outer boundary thereof, layering a first electrode onto the piezoelectric layer within the envelope and substantially missing from within the border region, depositing a piezoelectric layer onto the first electrode, layering a second electrode onto the piezoelectric layer and within the inner boundary of the border region, and depositing a frame-like structure of mass loading onto the second electrode, wherein the frame-like structure is defined within inner and outer boundaries of the border region.

The acoustic wave device may comprise a bandpass filter such that the piezoelectric layer provides a coupling coefficient sufficient to accommodate a preselected bandwidth of the filter.

As will be clear to those skilled in the art, the present invention addresses the suppression of spurious modes between fs and fp and that of the resonant mode below fs. In order to avoid an occurrence of the unwanted additional resonant modes with the use of a border region to suppress spurious Lamb modes, one embodiment of the invention comprises a resonator structure that reduces the strength of the driving electric field underneath the ring structure area. The resonator structure electrode area may be designed such that within the ring region, either a bottom electrode or a top electrode is missing. If one of these two electrodes is missing in the ring region, there is almost no direct electric field. By restricting the electrode area, it is possible to minimize the strength of the parasitic electric field and suppress the resonant mode.

In one embodiment of the present invention, the resonator may comprise a layer of piezoelectric material embedded between two metal electrodes. The top electrode may have an additional layer of mass loading deposited substantially within a border edge of the electrode forming the border region. The area of the bottom electrode extends over the active area of the resonator such that it is not substantially located directly underneath the border region.

BRIEF DESCRIPTION OF THE DRAWINGS

For a fuller understanding of the invention, reference is made to the following detailed description, taken in connection with the accompanying drawings illustrating various embodiments of the present invention, in which:

FIG. 4a is a Smith Chart plot of a known resonator illustrating a width of the ring structure not wide enough to provide optimum spurious suppression between fs and fp;

FIG. 4b is a Smith plot illustrating one case in which the border region width is optimally wide enough to suppress the spurious modes between fs and fp, but exhibits a strong resonant mode below fs, and wherein the curve would generally be a smooth circle like form without a strong resonant mode distortion when employing the teachings of the present invention;

FIG. 4c is a plot of spurious modes characteristics as a function of the border region width, wherein Curve 1 illustrates results with a relatively small width, wherein a resonant mode below fs is very well suppressed, and wherein the extension of Curve 1 illustrated with dashed lines results from mass loading and electrode structures according to the teachings of et present invention;

DETAILED DESCRIPTION OF EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternate embodiments.

Figure 5:
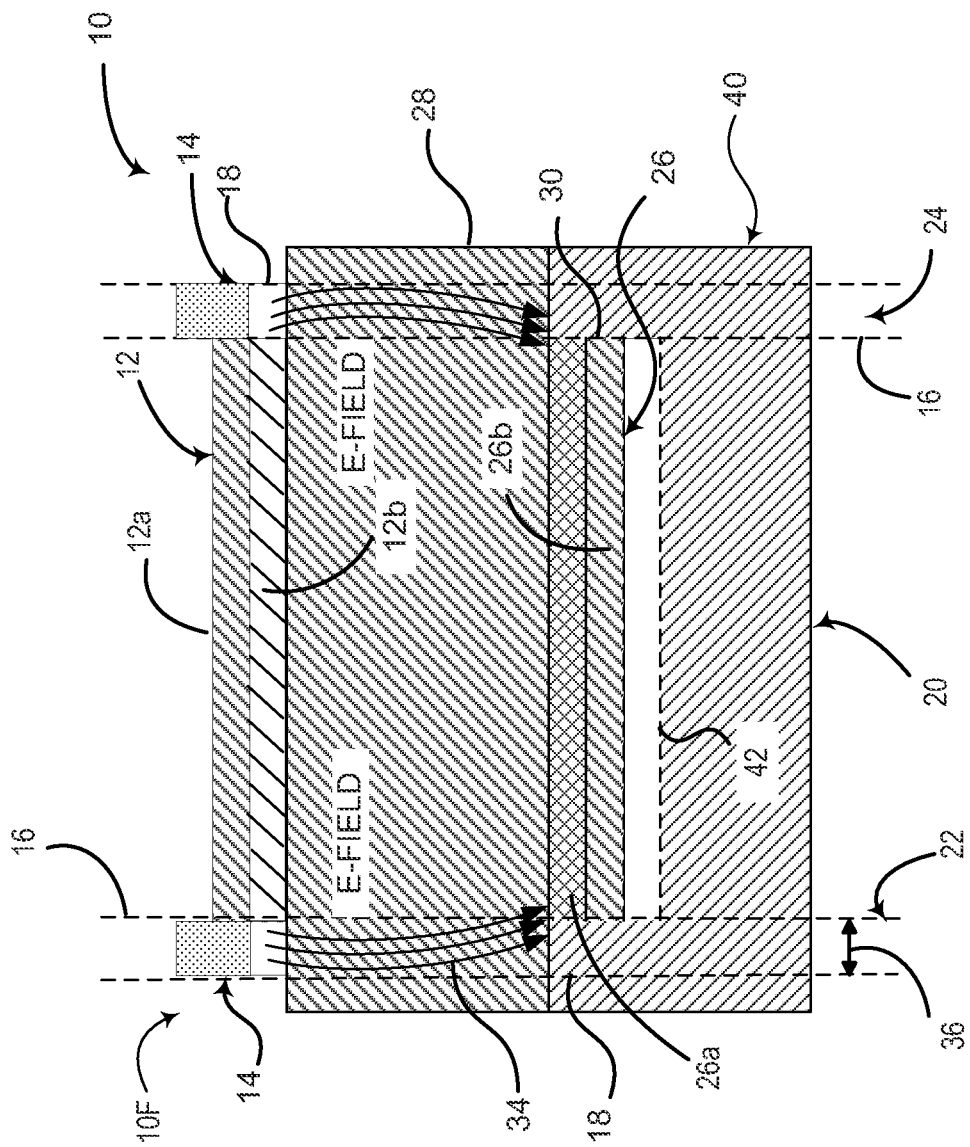
FIG. 5 is a diagrammatical cross section illustration of one BAW resonator structure of the present invention, wherein a layer of piezoelectric material is embedded between two metal electrodes forming a single frequency resonator.
Figure 6:
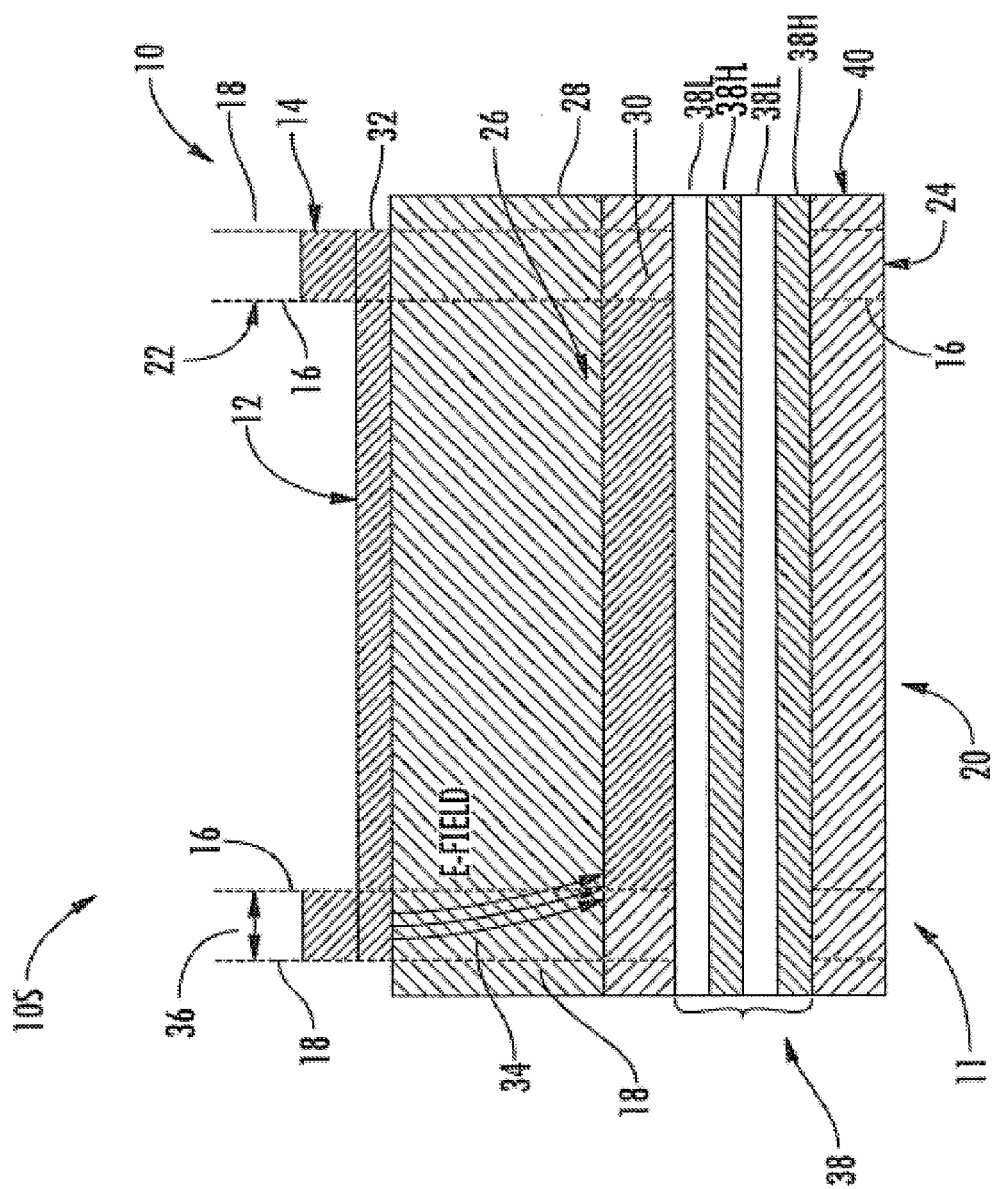
FIG. 6 is a diagrammatical illustration of an alternate embodiment of the invention, wherein a resonator structure is mounted on a reflective mirror, and wherein the resonator structure and the reflective layers are deposited on a supporting substrate.

With reference initially to FIGS. 5 and 6, one embodiment of the invention comprises a boundary acoustic wave (BAW) resonator 10 herein described as comprising a first electrode 12 and a frame-like structure 14 of mass loading adjacent the first electrode. The frame-like structure 14 is herein defined as being within an inner boundary 16 and an outer boundary 18. A central area 20 extends through the resonator 10 within an envelope 22 of the inner boundary 16. A border region 24 extends through the resonator 10 and is defined within the inner and outer boundaries 16, 18, respectively, of the frame-like structure 14. A second electrode 26, opposing the first electrode 12, is positioned within the envelope 22 and not in the border region 24. It will be understood by those of skill in the art that regions and boundaries will generally be defined within acceptable tolerances. A layer 28 of piezoelectric material is embedded between the first and second electrodes 12, 26, wherein an active resonator area is provided within the central area 20. As will come to the mind of those skilled in the art now having the benefit of the teachings of the present invention, and as illustrated with reference to FIGS. 5 and 6, by way of example, the mass loading provided by the frame-like structure 14 is adjacent the first electrode 12, but is not restricted to a specific portion or location within the inner boundary 16 and the outer boundary 18.

Optionally for one embodiment of the invention, and with continued reference to FIG. 6, an outer edge 30 of the second electrode 26 is generally aligned with the inner boundary 16 of the frame-like structure 14, and an outer edge 32 of the first electrode is generally aligned with the outer boundary 18 of the frame-like structure.

With reference again to FIG. 5, the BAW resonator 10 comprises the piezoelectric layer 28 embedded between two metal electrodes 12, 26 forming a single frequency resonator. Such a single frequency resonator exhibits a series resonant frequency (fs) and a parallel resonant frequency (fp). The bandwidth of the filter depends upon the separation of the fs and fp that is dependent on the coupling coefficient of the piezoelectric layer 28. Typically, an aluminum nitrite (AlN) layer is chosen because of its strong coupling coefficient. The metal electrodes 12, 26 may be a single metal such as aluminum, tungsten, copper, and the like. Optionally, the electrodes 12, 26 may be metal alloys. By way of example, one alloy may be made of copper doped with aluminum (AlCu).

Alternatively, the electrodes 12, 26 may be formed from multiple layers 12a, 12b, 26a, 26b of metal as illustrated with continued reference to FIG. 5. For the embodiment herein illustrated with reference to FIG. 5, the first electrode 12 is a top electrode and has the additional layer of mass loading frame-like structure 14 deposited substantially along its border edges 32 forming the border region 24. The mass loading material may be tungsten (W) or an alloy such as AlCu, by way of example. As herein further illustrated by way of example, the second electrode 26 is the bottom electrode and is restricted substantially to the active central area 20 of the resonator 10 and is substantially missing from the area directly underneath the mass loading frame-like structure 14. Since a vertical electric field (E-field) 34 component directly in the border region is essentially nonexistence, a parasitic electric field underneath the frame like structure and in the border region area is significantly minimized. As a result, a resonant spurious mode below fs (see dashed line in FIG. 4b) is essentially eliminated. Further, and with reference again to FIG. 4c, the extension of Curve 1 illustrated with dashed lines results from mass loading and electrode structures according to the teachings of the present invention. In essence, the present invention avoids the well known undesirable issues addressed in FIGS. 4a and 4b.

Additionally, the frame-like structure may include open pathways for receiving electrical leads to make contact with the electrode. It may be preferred that the electrical leads to the electrodes be run underneath the opening pathway area of the border ring to further minimize direct parasitic electrical field effects. A width 36 of the border region 24 can be made optimally wide to suppress the spurious Lamb modes occurring between fs and fp.

With reference again to FIG. 6, one resonator structure 11 includes the resonator 10 herein described by way of further example, mounted on an acoustically reflective mirror 38 for reducing energy leakage. The reflective mirror 38 may be formed using multiple layers of low acoustic impedance material 38L and high acoustic impedance material 38H. As further illustrated with continued reference to FIG. 6, the resonator structure 11 along with the reflective layers 38 is deposited on a supporting substrate 40 forming the structure as one solidly mounted bulk acoustic resonator (SBAR) 10S, by way of example.

Alternatively and with reference again to FIG. 5, the mirror 38 may be formed by an air cavity 42 in the supporting substrate 40 forming what is commonly referred as a thin film bulk acoustic resonator (FBAR) 10F.

Yet further and as illustrated with reference to FIGS. 7a and 7b, the resonator 10 may be described as above to include the first electrode 12b (herein the bottom electrode) and the frame-like structure 14 of mass loading adjacent the bottom electrode. The frame-like structure 14 again defined as being within the inner boundary 16 and the outer boundary 18. The central area 20 extends through the resonator 10 within the envelope 22 of the inner boundary 16. The border region 24 extends through the resonator 10 and is defined within the inner and outer boundaries 16, 18, respectively, of the frame-like structure 14. The second electrode 26t (herein the top electrode), opposing the first electrode 12b, is positioned within the envelope 22 and not in the border region 24. The layer 28 of piezoelectric material is embedded between the first and second electrodes 12b, 26t, wherein an active resonator area is provided within the central area 20. However, unlike the structure of FIGS. 5 and 6, and as herein illustrated, the first electrode 12b is the bottom electrode and the second electrode 26 is the top electrode. The piezoelectric layer 28 is embedded between the top and bottom metal electrodes and the mass loading structure is formed substantially within the border region area of the bottom electrode. The top electrode 26t is substantially missing from the border region 24.

Figure 7A:
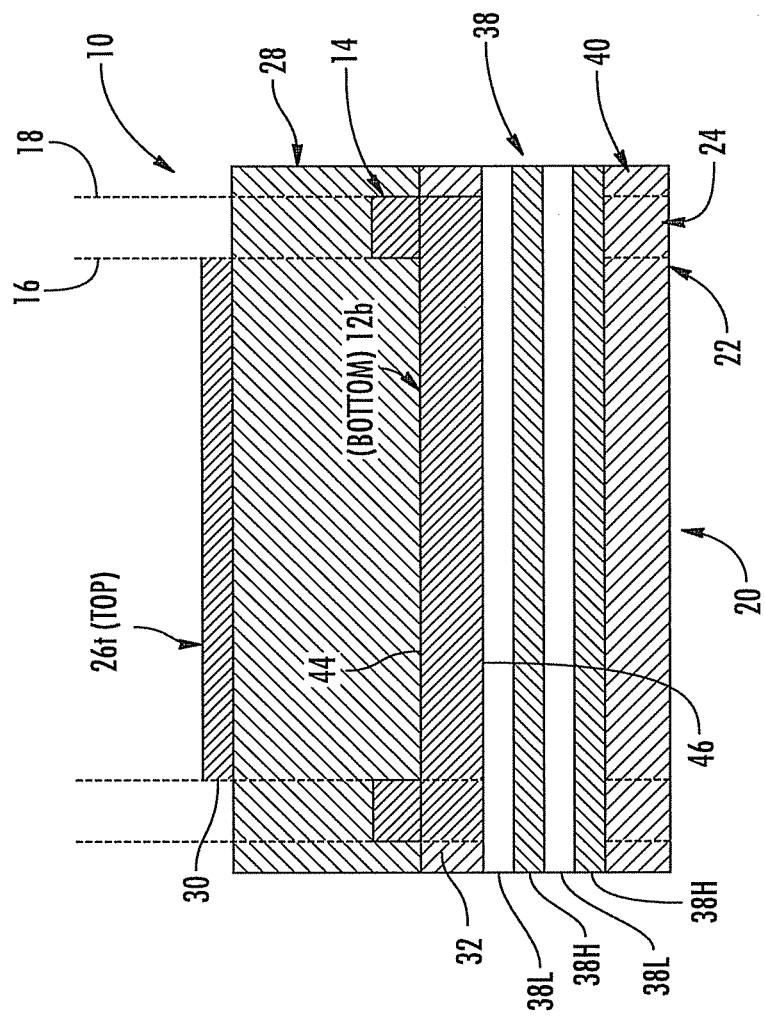
FIGS. 7a and 7b are diagrammatical cross sectional illustrations of further embodiments of the present invention, wherein a resonator comprises a piezoelectric layer embedded between top and bottom metal electrodes, and wherein a mass loading material is formed substantially along a border of the bottom electrode.

With continued reference to FIG. 7a, the frame-like structure 14 is adjacent an inner surface 44 of the bottom electrode 12b, and facing the piezoelectric layer 28. Optionally, and as illustrated by way of example with reference to FIG. 7b, the frame-like structure 14 may be adjacent an outer surface 46 of the bottom electrode 12b. For the embodiment illustrated with reference to FIG. 7b, the frame-like structure 14 is herein adjacent the mirror 38.

Figure 8:
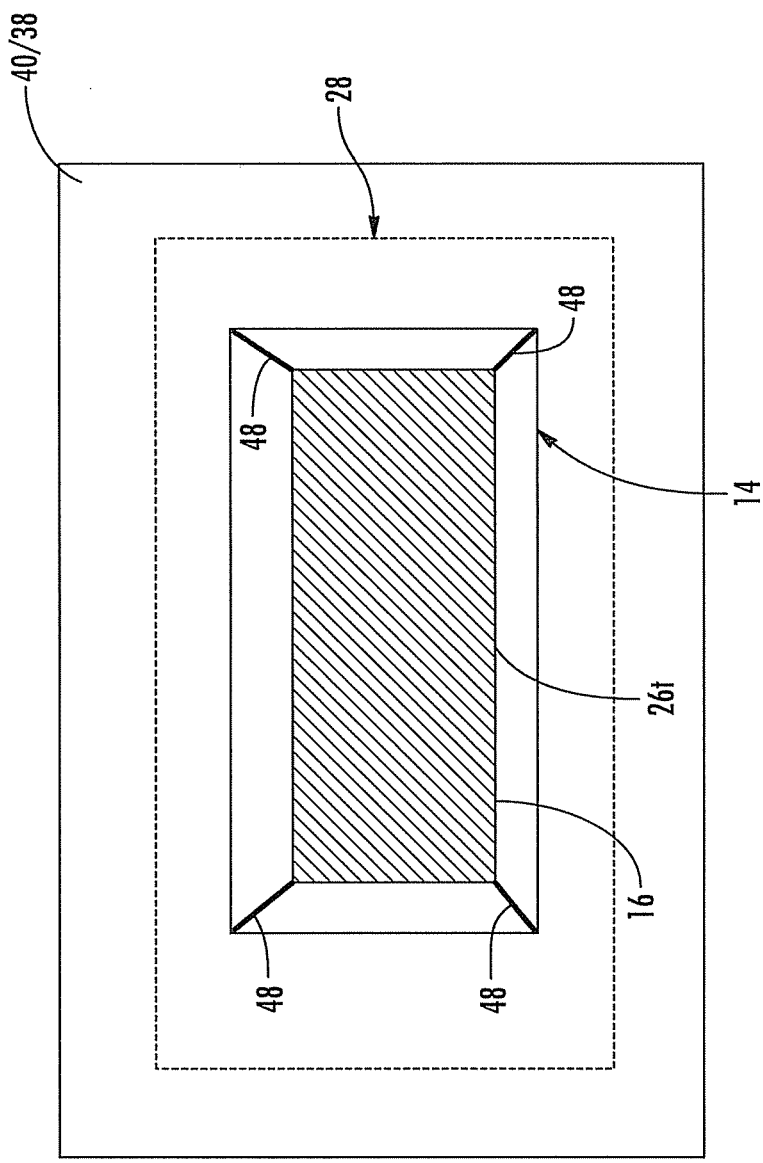
FIG. 8 is a diagrammatical plan view illustrating one embodiment of the invention having depleted corners of a ring structure for providing pathways for electrode lead connections.

As illustrated with reference to FIG. 8, the frame-like structure 14 includes a rectangular shaped ring having an opening therein forming the inner boundary 16. Further, the frame-like structure 14 includes open pathways 48 sufficient for receiving electrical leads for contacting the electrodes 12, 26.

Figure 7B:
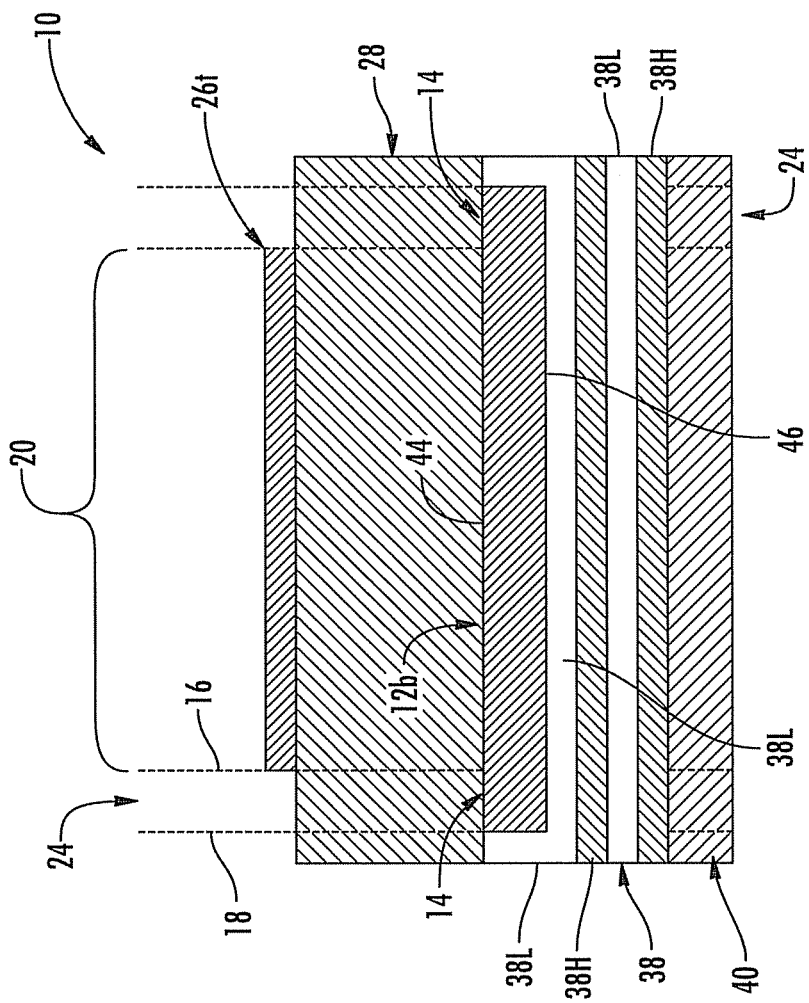

By way of example, one method of fabricating the BAW resonator 10 of FIG. 7b may comprise selecting the supporting substrate 40, forming the reflective mirror 38 onto a surface of the supporting substrate, depositing the frame-like structure 14 of mass loading onto the reflective mirror, layering the first electrode 12b onto the frame-like structure within the outer boundary 18 thereof, depositing the piezoelectric layer 28 onto the first electrode 12b, and layering the second electrode 26t onto the piezoelectric layer, the second electrode positioned within the envelope and substantially missing from within the border region.

With regard to the embodiment of FIG. 7a, by way of further example, one fabricating method may comprise selecting the supporting substrate 40, forming the reflective mirror 38 onto a surface of the supporting substrate, layering the first electrode 12b onto the reflective mirror while staying within the envelope 22, depositing the frame-like structure 14 of mass loading onto the first electrode 12b, depositing the piezoelectric layer 28 onto the first electrode and frame-like structure, and layering the second electrode 26t onto the piezoelectric layer and within the inner boundary of the border region.

By way of further example, the method may comprise a) selecting the supporting substrate. Silicon is one desirable supporting substrate because it is cost effective and easily workable.

Fabricating an acoustically reflective mirror. In one embodiment, alternative layers of low acoustic impedance (SiOx) and high acoustic impedance (AlN) are used to reflect the leakage energy back to the resonator structure. The thickness of these alternative layers may be adjusted but is typically set at about a quarter of the acoustic wavelength of the resonator structure.

c) Defining a bottom electrode area to generally cover the active area of the resonator structure.

d) Depositing a piezoelectric layer. The selection of the piezoelectric material should provide strong enough coupling coefficient to accommodate the required bandwidth of the bandpass filter. Typically, AlN is used as the piezoelectric material.

e) Defining a top electrode pattern area. The electrode pattern may be single metal, alloy or multiple layers of metal.

f) Defining a border region. Deposition of a mass loading material substantially along the edges of the top electrode pattern. The mass loading may be a single metal layer like tungsten. It may be an alloy like AlCu or may be multiple layers of metal like tungsten and AlCu. The border region area may have certain areas particularly at the corners depleted of metal allowing for the bottom electrode to extend to a lead connection without experiencing a direct electric field. By way of example, FIG. 8 illustrates one embodiment having the depleted corners of the ring providing pathways 48 for electrode lead connections.

Figure 9A:
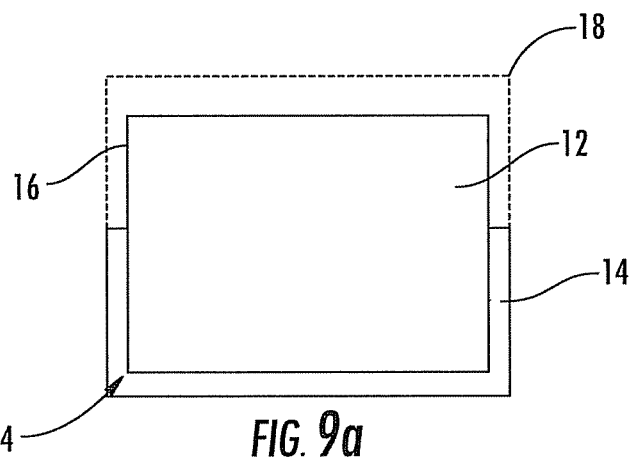
FIGS. 9a-9c are diagrammatical plan view illustrations of alternate embodiments of mass loading structures in keeping with the teachings of the present invention.
Figure 9B:
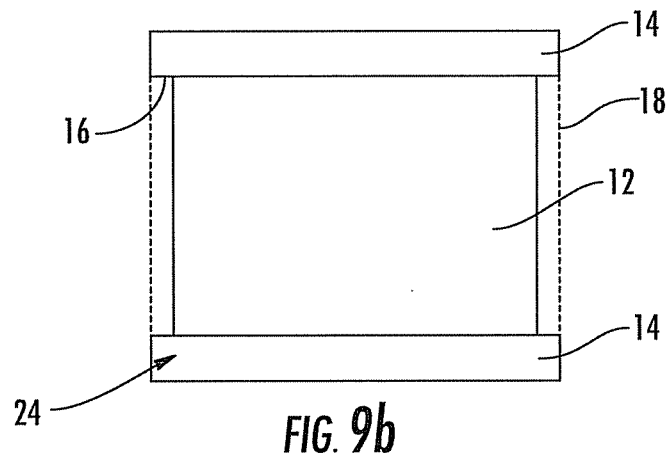
Figure 9C:
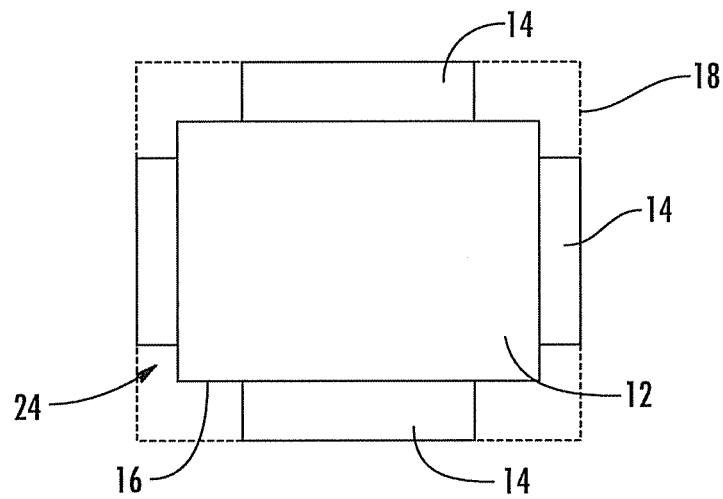
Figure 10A:
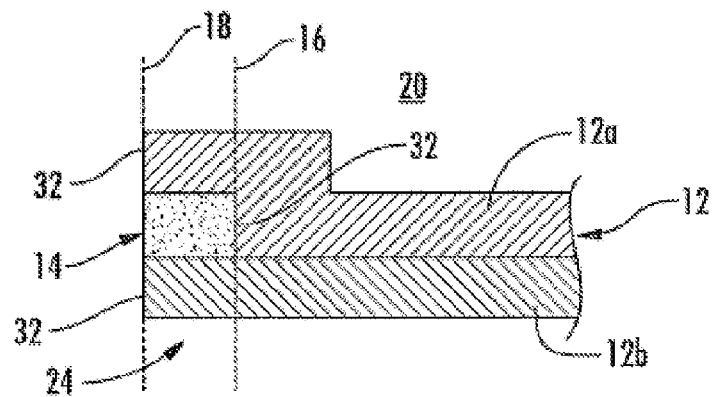
FIGS. 10a-10d are diagrammatical cross section illustrations of alternate embodiments of mass loading and first electrode structure combinations in keeping with the teachings of the present invention.
Figure 10B:
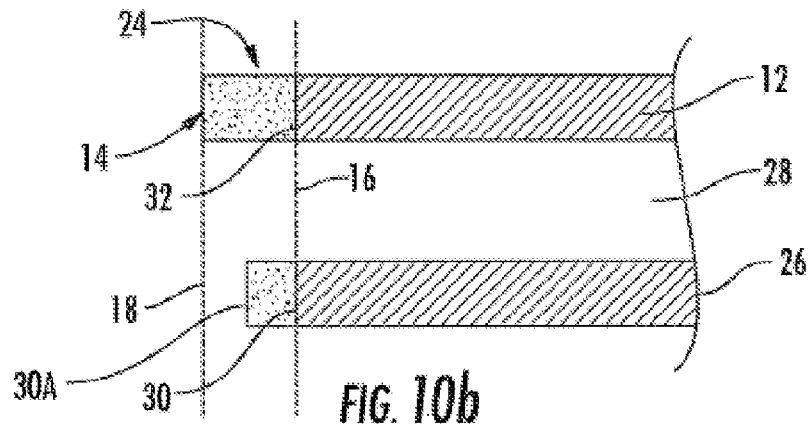
Figure 10C:
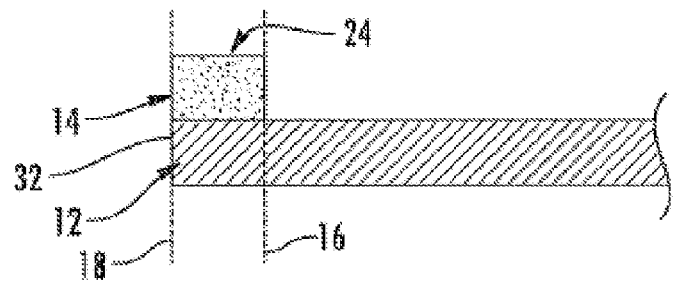
Figure 10D:
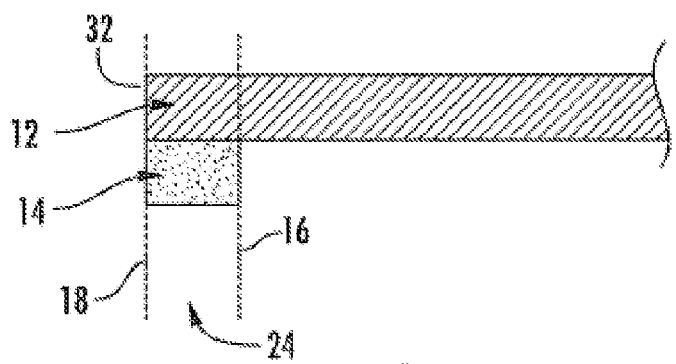

The resonator stricture may be such that mass loading provided by the frame-like structure 14 is distributed only within approximately half of the border region 24, as illustrated with reference to FIGS. 9a-9c. It has been realized that beneficial effects result with mass loading within the border region 24 as above generally described, but also with the mass loading spread out within the frame-like structure 14 with as little as half including the mass loading.

As above described, and further with reference to FIGS. 10a-10d, the mass loading of the frame-like structure may be provided by various embodiments including the frame-like structure formed from a metal heavier than the metal of the electrode and from various formations of the frame-like structure proximate the electrode including outside, above, below, and between a layered electrode. It will therefore come to the mind of those skilled in the art, now having the benefit of the teachings of the present invention, that various other mass loading distributions within the border region 24 may be employed. As earlier described with reference to FIGS. 5 and 6, and with continued reference to FIG. 10b, while the second electrode 26, opposing the first electrode 12, is positioned within the envelope 22 and not in the border region 24, it will be understood by those of skill in the art that regions and boundaries will generally be defined within acceptable tolerances. As called for, the second electrode 26 is substantially missing from within the border region 24, wherein substantially is herein described as at least 50% of the border region does not include the second electrode. As diagrammatically illustrated with reference again to FIG. 10b, while the outer edge 30 of the electrode 26 is desirably at the inner boundary 16, it is understood that edges 30A of the second electrode may encroach the boundary region, but there being no more than 50% of the boundary region including the second electrode.

Figure 1:
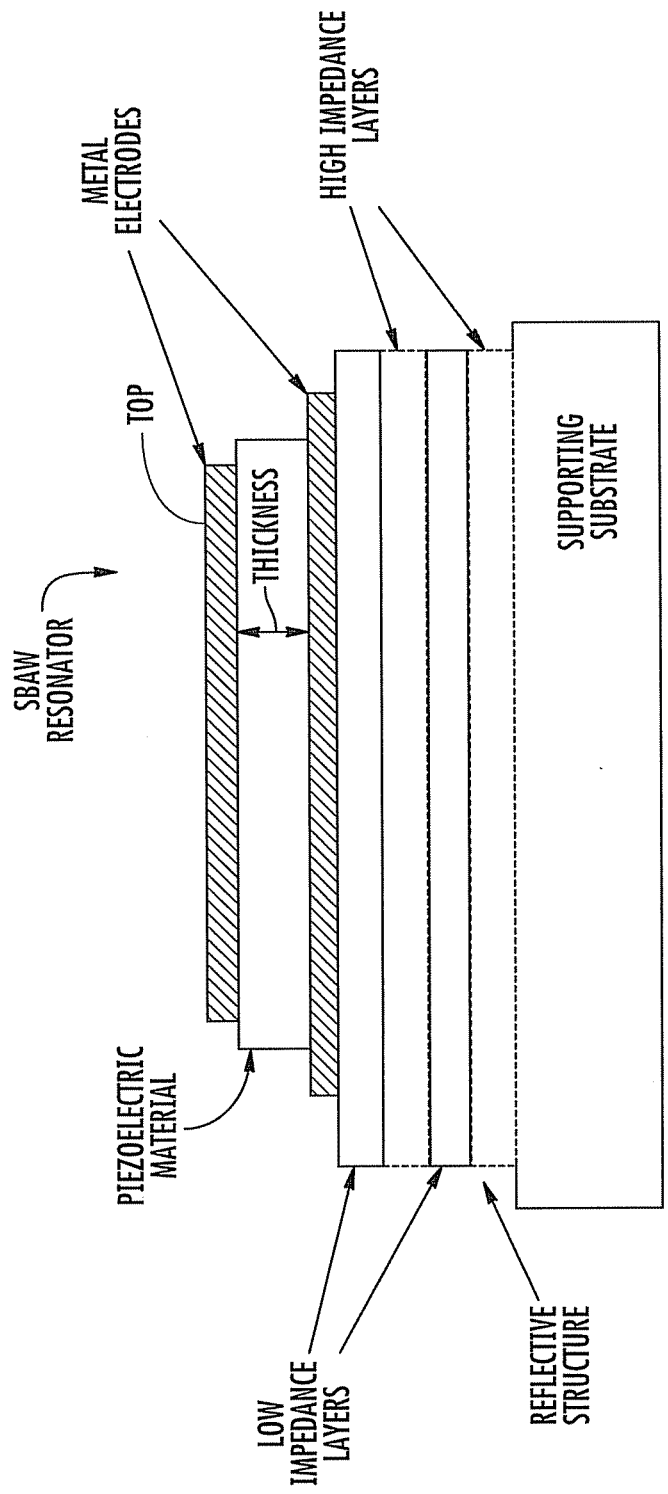
FIG. 1 is a diagrammatical illustration of one known resonator structure solidly mounted on a layer of a reflective structure having alternatively high and low acoustic impedance characteristics, wherein such BAW resonators are commonly known as a solidly mounted BAW resonator (SBAR)
Figure 2:
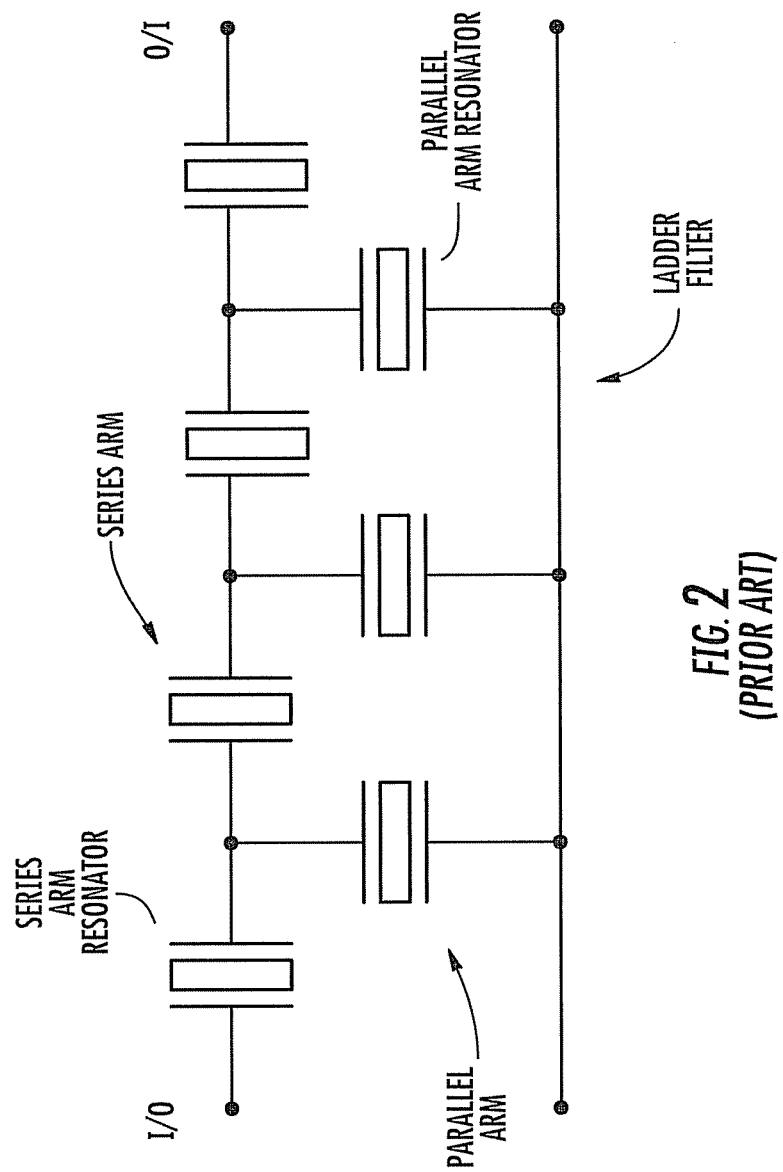
FIG. 2 is a diagrammatical illustration of a ladder filter having multiple resonators typically arranged in a series arm or parallel arms of a ladder filter.
Figure 3:
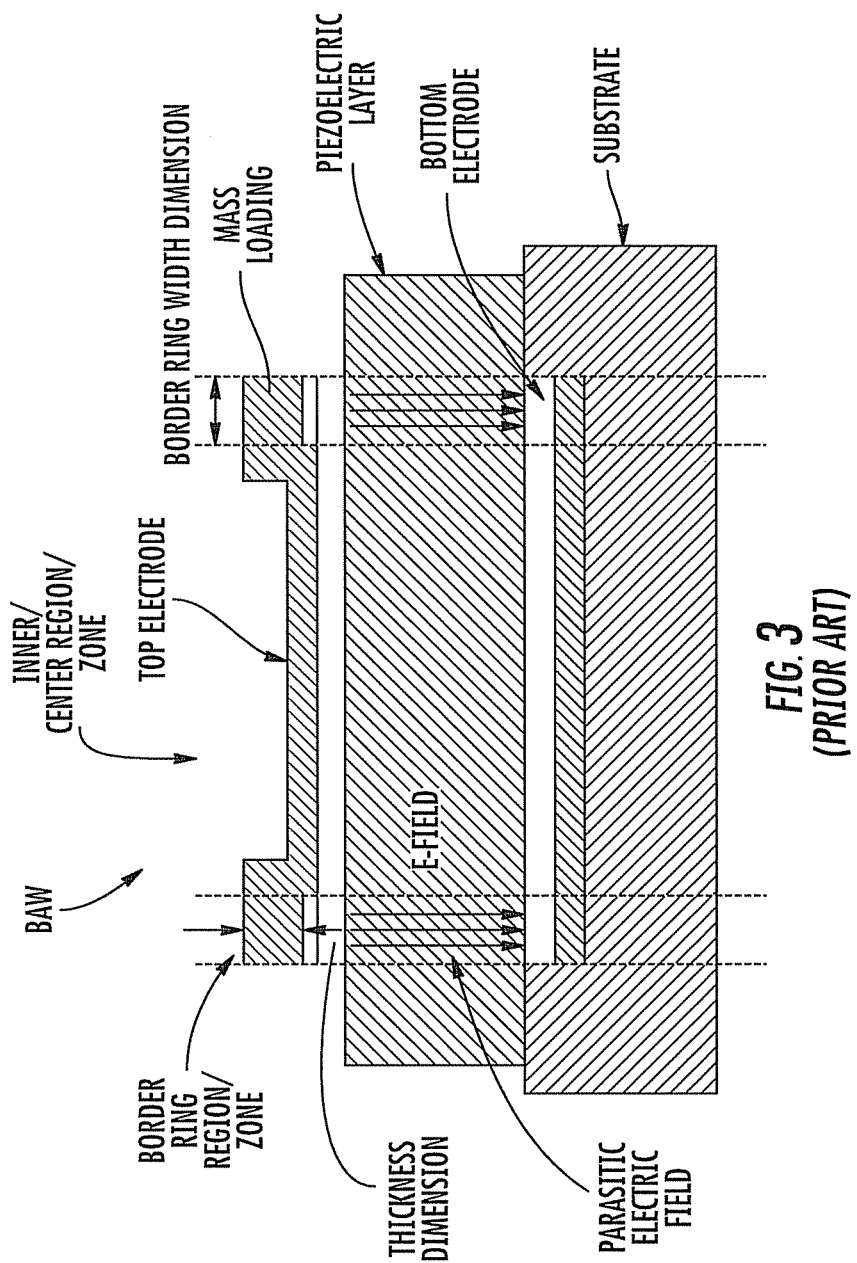
FIGS. 3 and 3a are diagrammatical cross sectional view and top plan view, respectively, of a BAW resonator structure employing a ring-like region at boundaries of an active area for suppressing spurious Lamb modes.
Figure 3A:
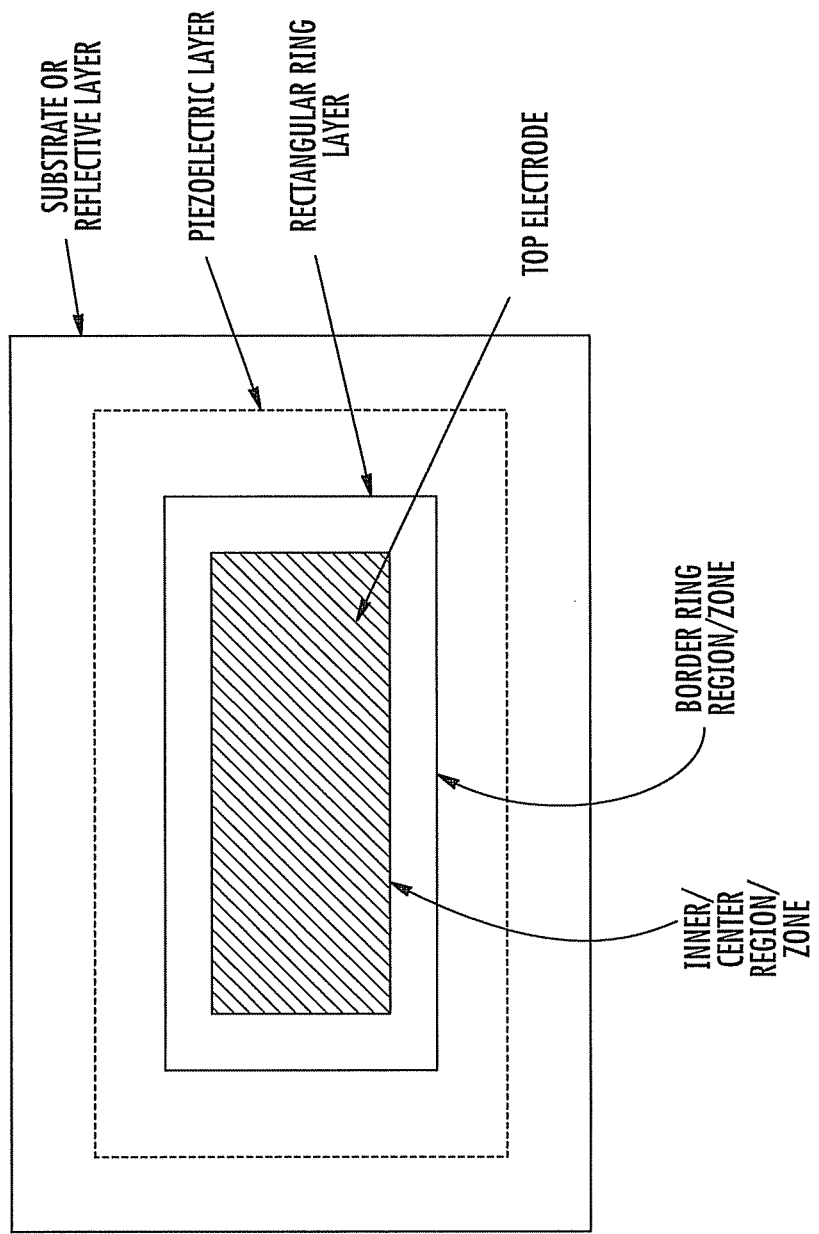

Typically, a plurality of SBAR or FBAR is arranged in the series arm or the parallel arm forming the ladder filter configuration earlier described with reference to FIG. 2. Fabrication processes of the SBAR, FBAR and the ladder filter may employ well-known design guidelines.

Many modifications and other embodiments of the invention will come to the mind of one skilled in the art now having the benefit of the teachings presented in the foregoing descriptions and associated drawings. Therefore, it is understood that the invention is not to be limited to the specific embodiments disclosed, and that modifications and embodiments are intended to be included within the scope of the appended claims.

That which is claimed is:

1. A resonator structure comprising:
   a first electrode;
   a frame-like structure of mass loading defined by inner and outer boundaries thereof, and wherein a central area extends through the resonator within an envelope of the inner boundary, and a border region extends through the resonator as defined within the inner and outer boundaries of the frame-like structure;
   a second electrode opposing the first electrode, the second electrode positioned within the envelope wherein the second electrode is absent from at least half the border region, thus substantially missing therefrom; and
   a layer of piezoelectric material embedded between the first and second electrodes, wherein an active resonator area is substantially within the central area and substantially missing from within the border region;
   wherein the frame-like structure of mass loading is embedded within multiple layers of the first electrode, or the frame-like structure of mass loading is embedded between the layer of piezoelectric material and the first electrode.

2. The resonator structure according to claim 1, wherein an outer edge of the second electrode is generally aligned with the inner boundary of the frame-like structure.

3. The resonator structure according to claim 1, wherein an outer edge of the first electrode is generally aligned with the outer boundary of the frame-like structure.

4. The resonator structure according to claim 1, wherein the frame-like structure comprises at least one of a single metal and alloy.

5. The resonator structure according to claim 4, wherein the single metal comprises tungsten, and wherein the alloy comprises AlCu.

6. The resonator structure according to claim 1, wherein the frame-like structure includes open pathways sufficient for receiving electrical leads therethrough.

7. The resonator stricture according to claim 1, wherein the frame-like structure comprises the mass loading distributed throughout at least half of the border region.

8. The resonator structure according to claim 1, wherein the frame-like structure comprises a rectangular shaped ring having an opening therein forming the inner boundary.

9. The resonator structure according to claim 1, wherein at least one of the first and second electrodes and the frame-like structure comprise multiple layers.

10. The resonator structure according to claim 9, wherein the multiple layers comprise multiple metallic layers comprising at least one of a metal and an alloy.

11. The resonator structure according to claim 10, wherein the metallic layers comprise tungsten and AlCu.

12. The resonator structure according to claim 1, wherein the first electrode is formed from a metallic material characterized by a first density and the frame-like structure is formed from a metallic material characterized by a second density, and
   wherein the second density is greater than the first density.

13. The resonator structure according to claim 1, wherein the piezoelectric material comprises AlN.

14. The resonator structure according to claim 1, further comprising a substrate, wherein one of the first and second electrodes is supported thereby.

15. The resonator structure according to claim 14, wherein the substrate comprises a cavity therein, the cavity extending only within the central area and sufficient for providing an acoustic mirror.

16. The resonator structure according to claim 14, wherein the substrate comprises silicon.

17. The resonator structure according to claim 1, further comprising an acoustically reflective mirror proximate one of the first and second electrodes.

18. The resonator structure according to claim 17, wherein the reflective mirror comprises multiple and alternating layers of low and high acoustic impedance material.

19. The resonator structure according to claim 18, wherein the low acoustic impedance material is adjacent the one electrode.

20. The resonator structure according to claim 18, wherein the layers of low acoustic impedance comprise SiOx and the layers of high acoustic impedance comprise AlN.

21. The resonator structure according to claim 18, wherein a thickness dimension of each layer is about a quarter of an acoustic wavelength of the resonator structure.

22. The resonator structure according to claim 17, wherein the reflective mirror comprises a cavity therein, the cavity extending only within the central area and adjacent the electrode.

23. A resonator structure comprising:
a first electrode;
a frame-like structure of mass loading adjacent the first electrode, wherein the frame-like structure is defined within inner and outer boundaries thereof, and wherein a central area extends through the resonator within an envelope of the inner boundary, and a border region extends through the resonator as defined within the inner and outer boundaries of the frame-like structure, and wherein the frame-like structure includes open pathways sufficient for receiving electrical leads therethrough;
a second electrode opposing the first electrode, the second electrode positioned within the envelope;
a substrate supporting one of the first and second electrodes and comprising a cavity therein, the cavity extending only within the central area and sufficient for providing an acoustic mirror; and
a layer of piezoelectric material embedded between the first and second electrodes, wherein an active resonator area is substantially within the central area and is substantially missing from within the border region.

24. A resonator structure comprising:
a first electrode;
a frame-like structure of mass loading adjacent the first electrode, wherein the frame-like structure is defined within inner and outer boundaries thereof, and wherein a central area extends through the resonator within an envelope of the inner boundary, and a border region extends through the resonator as defined within the inner and outer boundaries of the frame-like structure;
a second electrode opposing the first electrode, the second electrode positioned within the envelope wherein the second electrode is absent from at least half the border region, thus substantially missing therefrom;
an acoustically reflective mirror proximate one of the first and second electrodes and comprising a cavity therein, the cavity extending only within the central area and adjacent the electrode; and
a layer of piezoelectric material embedded between the first and second electrodes, wherein an active resonator area is substantially within the central area and is substantially missing from within the border region.

* * * * *